(12) United States Patent
Brown et al.

(10) Patent No.: US 9,210,662 B1
(45) Date of Patent: Dec. 8, 2015

(54) ADAPTIVE BATTERY LIFE EXTENSION

(71) Applicant: Apple Inc., Cupertino, CA (US)

(72) Inventors: Alexander B. Brown, Cupertino, CA (US); Gaurav Kapoor, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/290,795

(22) Filed: May 29, 2014

(51) Int. Cl.
H04B 1/38 (2015.01)
H04W 52/02 (2009.01)
H04M 1/02 (2006.01)

(52) U.S. Cl.
CPC ........ *H04W 52/0261* (2013.01); *H04M 1/0202* (2013.01); *H04M 2001/0204* (2013.01)

(58) Field of Classification Search
CPC .......... H04W 52/0261; H04M 1/0202; H04M 2001/0204
USPC ............ 455/574; 713/300; 320/132, 106, 115
See application file for complete search history.

(56) References Cited

U.S. PATENT DOCUMENTS

| 7,888,913 B1 * | 2/2011 | Marty et al. ................... 320/132 |
| 2009/0164152 A1 | 6/2009 | Creus et al. |
| 2013/0013235 A1 | 1/2013 | Takahashi |
| 2013/0278223 A1 | 10/2013 | Li et al. |
| 2013/0346762 A1 * | 12/2013 | Hodges et al. ................ 713/300 |
| 2014/0082383 A1 | 3/2014 | De Cesare et al. |
| 2014/0082384 A1 | 3/2014 | De Cesare et al. |
| 2014/0129163 A1 | 5/2014 | Beztner |

FOREIGN PATENT DOCUMENTS

| CN | 102833385 A | 12/2012 |
| WO | WO 03/071617 A2 | 8/2003 |
| WO | WO 2014/051982 A1 | 4/2014 |

OTHER PUBLICATIONS

PCT/US2015/028353, International Search Report and Written Opinion, Mailed Jul. 23, 2015, 13 pages.
Nusawat, P, et al, "Battery Discharge Rate Prediction Model for Mobile Phone Using Data Mining," 2014 6th International Conference on Knowledge and Smart Technology (KST), IEEE, Jan. 30, 2014, pp. 67-74.

* cited by examiner

*Primary Examiner* — Amancio Gonzalez
(74) *Attorney, Agent, or Firm* — Blakely, Sokoloff, Taylor & Zafman LLP

(57) ABSTRACT

According to one embodiment, a first battery number is determined representing a battery condition of a battery of a mobile device using a predictive model, where the predictive model is configured to predict future battery conditions based on a past battery usage of the battery. A second battery number is determined representing the battery condition using a drain model, where the drain model is configured to predict a future battery discharge rate based on a past battery discharge rate. A third battery number is determined representing the battery condition based on a current battery level corresponding to a remaining life of the battery at the point in time. Power management logic performs a power management action based on the battery condition derived from at least one of the first battery number, the second battery number and the third battery number.

24 Claims, 13 Drawing Sheets

ADAPTIVE BATTERY LIFE EXTENSION

FIELD OF THE INVENTION

Embodiments of the present invention relate generally to power management of a portable device. More particularly, embodiments of the invention relate to adaptive battery life extension of a portable device.

BACKGROUND

Power management of a data processing system often involves techniques for reducing the consumption of power by components in the data processing system. A data processing system may be a laptop or otherwise portable computer, such as a handheld general purpose computer or a cellular telephone. The management of power consumption in a portable device which is powered by one or more batteries is particularly important because better power management usually results in the ability to use the portable device for a longer period of time when it is using only battery power.

As devices become more complicated and their capabilities more varied, it becomes increasingly difficult to make the best power management decisions from deep within the system. While designers have been successful in making decisions about the hardware state within a central power management driver, they are not able to account for blocks outside the hardware.

Users of battery powered devices generally prefer that the battery does not run out while they are using the device. User level power management may try to extend the life of the battery by reducing power consumption at the cost of reduced performance as the battery approaches depletion. Most of the conventional systems perform such power management actions only when the battery is already very low. Sometimes this may amount to too little too late.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
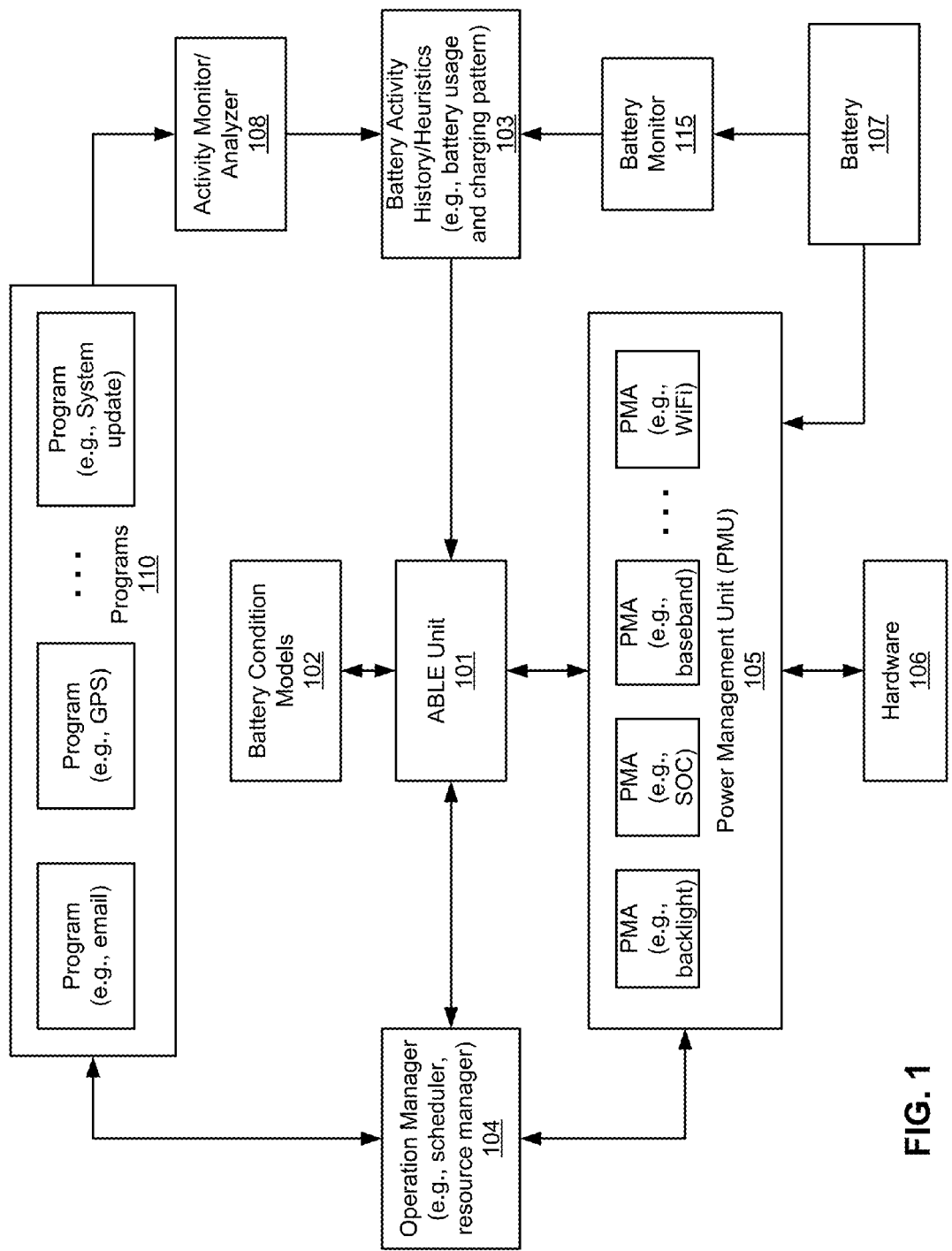
FIG. 1 is a block diagram illustrating an example of a portable device according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, various battery condition models (also simply referred to as battery models) are utilized to predict future battery conditions for the purpose of extending the battery life of a battery of a mobile device before the next predicted recharge of the battery. When an operation manager of an operating system of the mobile device requests information concerning the current or near future battery condition, an adaptive battery life extension (ABLE) unit running within operating system determines or calculates a battery operating number (BON), also simply referred to as a battery number or battery condition representation, representing a battery condition at the point in time using the battery condition models. Based on the battery number provided by the ABLE unit, the operation manager can decide whether to go ahead performing the operation or defer performing the operation until later or until the battery condition improves. For example, if the predicted battery condition is above a predetermined battery condition threshold (also referred to as battery number threshold), the operation is performed; otherwise, the operation may be deferred.

In one embodiment, the battery models include at least a predictive model, a drain model, and a direct model. The predictive model is configured to predict future battery conditions (e.g., future battery levels) based on past battery operating heuristics including battery levels captured at different points in time in the past and battery charging patterns during one or more periods of time in the past. The drain model is configured to predict future battery conditions (e.g., future battery discharge rate) based on battery discharge patterns during a period of time in the past. The direct model is configured to predict future battery conditions based on the current battery level at the point in time (e.g., by directly reading the battery level from the battery). The ABLE unit then determines a battery number presenting the battery condition based on the prediction provided by at least one of the predictive model, drain model, and direct model. In one embodiment, if the battery condition is predicted as poor or alternatively, if it is predicted that the remaining battery life will not last before the predicted next recharge of the battery, one or more of those models may be adjusted, such that the battery condition will be considered poorer and more actions will be stopped or deferred to preserve battery life until the next predicted recharge of the battery (e.g., soft-landing). Alternatively, the battery condition threshold may be raised to defer performing more actions.

In another embodiment, each of the models may be periodically examined to determine whether the model is still predictive (e.g., accurate enough to predict) before using the model. If one model is not predictive, the ABLE may fall back to another model for prediction. In one embodiment, the predictive model may be a preferred model to predict the future battery conditions. However, if the predictive model is not predictive, the drain model becomes the primary model for prediction. Similarly, if the drain model is not predictive, the direct model may be utilized. However, a combination of one or more of the models may be utilized if they are all predictive. In the event that a model is not predictive, a new model may be generated or adjusted, for example, based on more recently captured or tracked battery activity history and/or user or application behaviors.

FIG. 1 is a block diagram illustrating an example of a portable device according to one embodiment of the invention. For example, portable device 100 may be a Smartphone (e.g., iPhone™), a media player (e.g., iPod™), a tablet (e.g., iPad™), a laptop (e.g., Mac Book™), etc. Referring to FIG. 1, system 100 includes an operation manager 104 for managing software programs 110 hosted by an operating system and executed by a processor. Operation manager 104 may be a system component of the operating system, such as, for example, a scheduler or a resource manager. The operating system may be any kind of operating systems, such as, for example, iOS™, Windows™, Android™, LINUX, UNIX, or any other real-time or embedded operating systems.

In one embodiment, system 100 includes an ABLE unit 101 configured to estimate or predict battery conditions at that point in time and/or in the near future (e.g., next one to two charging cycles of the battery) based on battery activity history 103 using one or more battery condition models 102. Battery activity history 103 may include past battery levels as well as past system and application and component activities. For example, battery activity history 103 may include activities of programs 110 and/or user behaviors captured by activity analyzer 108 and battery usage and discharge patterns of battery 107 captured by power manage unit (PMU) 105 and/or battery monitor 115 (also referred to as an battery activity monitor). Battery monitor 115 may be variously implemented by 1) interrogating operating system (OS) facilities such as the scheduler and performance monitor or other OS systems for monitoring application activity including CPU time and use of subsystems, such as graphics processing unit (GPU), encoder/decoders, GPS network etc., or 2) by an application programming interface (API) which allows more detailed description of application activity which can be provided for system libraries or by explicit calls from applications and services. Battery monitor 115 may be implemented as a part of PMU 105. Battery activity history 103 may be stored as one or more databases in a persistent storage device of system 100. Activity monitor/analyzer 108 may monitor the activities of programs 110 via a set of application programming interfaces (APIs) and compile and/or infer user intents, user activity trends, and user behaviors of utilizing mobile device 100.

In one embodiment, battery condition models 102 are created to model and predict future battery conditions based on the past battery heuristics and user behaviors provided by battery activity history database 103. ABLE unit 101 utilizes one or more of battery models 102 to generate a battery number that represents a battery condition at that point in time and/or in the near future (e.g., next one to two charging cycles of the battery) based on the past battery usage and charging heuristics. In one embodiment, when operation manager 104 attempts to schedule or start a particular operation (e.g., intense data processing such as computation, content download, video streaming, system updates), which may be triggered by one or more of the corresponding programs 110, operation manager 104 communicates with ABLE unit 101 to inquire the current battery condition for the purpose of deciding whether it is appropriate to perform such an action based on the current battery condition. In response to the inquiry, ABLE unit 101 calculates a battery number representing the battery condition at that point in time based on past battery activity history 103 and/or current battery level using one or more of battery condition models 102. The calculated battery number is then provided to operation manager 104.

Note that an operation to be inquired herein refers to a discretionary or optional operation that is deferrable. For example, an operating system update from an operating system provider may be a discretionary operation since system 100 may be operating properly for a foreseeable future without the update, and such a system update operation is relatively expensive because it may involve downloading and installing a large amount of data. However, some other necessary operations may be performed regardless of the battery condition. For example, antivirus scanning for a Web page currently being browsed by a browser may be considered as a necessary action. The discretionary and necessary actions may be user configurable, for example, as a part of a power management profile or scheme.

In one embodiment, a higher battery number represents a better battery condition and lower battery number represents a poorer battery condition. In response to the battery number received from ABLE unit, operation manager 104 can decide whether to perform the intended operation given the battery condition represented by the battery number. For example, for a particular action associated with a particular program, if the battery number is above a certain battery condition threshold, the operation manager 104 may go ahead in scheduling or launching the action; otherwise, the action may be deferred. In one embodiment, each type of actions or each type of programs may be associated with a specific or different battery condition threshold. For a given battery number, some actions may be performed while some other actions may be deferred, dependent upon the specific thresholds associated with the types of the actions. Such threshold information may also be stored in a database of a persistent storage device.

Figure 2:
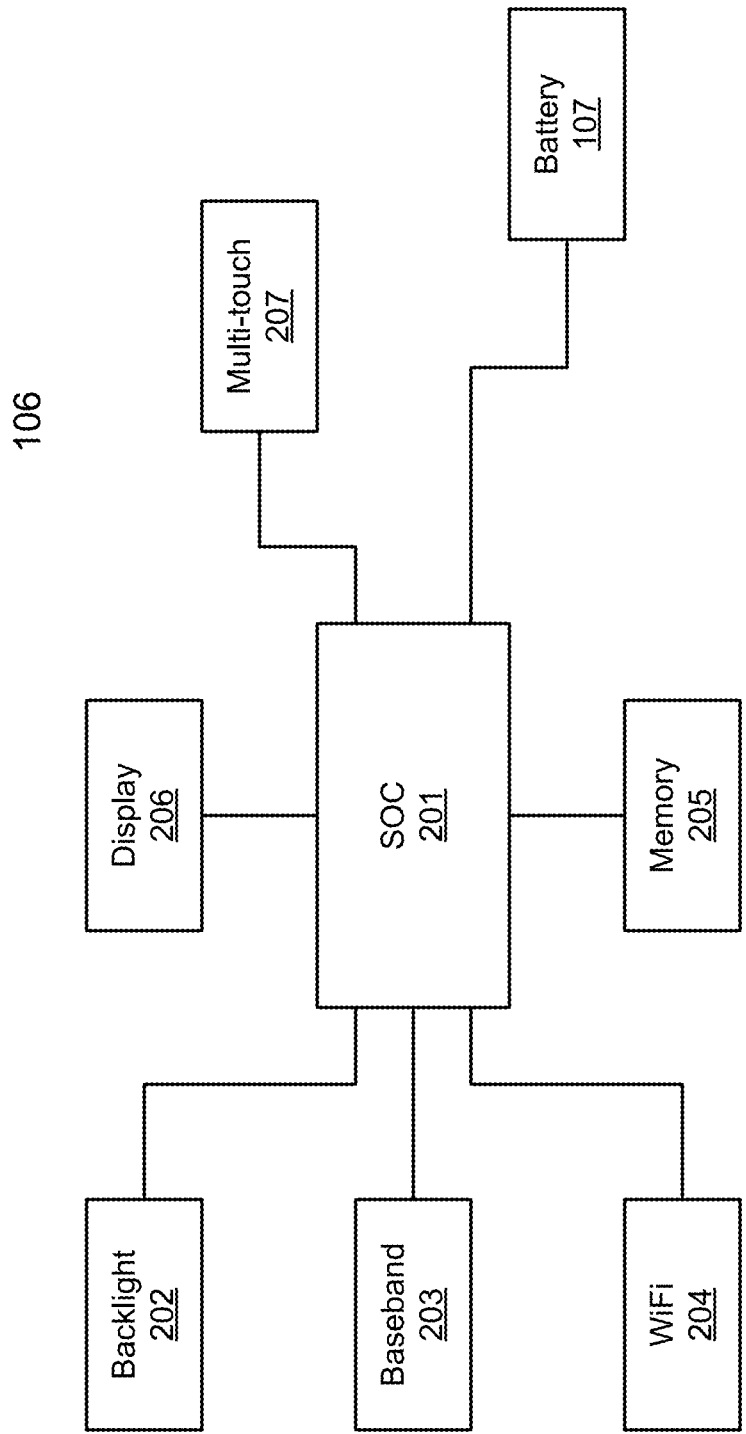
FIG. 2 is a block diagram illustrating a hardware configuration of a portable device according to one embodiment of the invention.

PMU 105 may include one or more power management agents (PMAs) to obtain power management status of hardware 106 and/or to perform certain power management actions on hardware 106 via the corresponding PMAs that include, but are not limited to, a backlight agent, a system-on-chip (SOC) agent, a baseband (e.g., RF frontend) agent, and a WiFi agent. Hardware 106 represents a variety of hardware devices or components, such as SOC chip 201, backlight circuit 202, baseband circuit 203, WiFi component 204, memory 205, display 206, multi-touch device or keyboard 207, and battery, as shown in FIG. 2.

According to one embodiment, battery usage monitor 115 is configured to monitor the daily battery usage and the daily battery charging pattern of portable device 100, and to compile battery activity history 103 which are stored in a persistent storage device of portable device 100. A particular battery usage level at a given point in time can be used to determine, in view of battery activity history 103, whether the user of portable device 100 is operating the portable device 100 in an abnormal manner (e.g., demanding more battery consumption than average), in which case certain power management actions may be performed on portable device to accommodate the abnormal usage of the portable device 100.

In one embodiment, activity analyzer 108 communicates with programs 110 via a set of APIs to obtain certain activity or event information of programs 110. Based on the activities of the programs 110, activity analyzer 108 can interpret or infer intent of a user that is currently utilizing the portable device and/or a period of time that the user intends to use the portable device without charging the battery. Based on the user intent or behaviors, ABLE 101 may instruct at least some of the PMAs in PMU 105 to perform certain power management actions on hardware 106. Based on the user intent or behaviors, ABLE 101 or activity analyzer 108 may predict the next time the user will recharge the mobile device. In addition, ABLE 101 may further communicate with, via operation manager 104, one or more of programs 110 to cause the programs to adjust (e.g., increase or reduce) certain operating parameters of the programs in an attempt to optimize the utilization of the remaining power capacity of battery 107.

Figure 3:
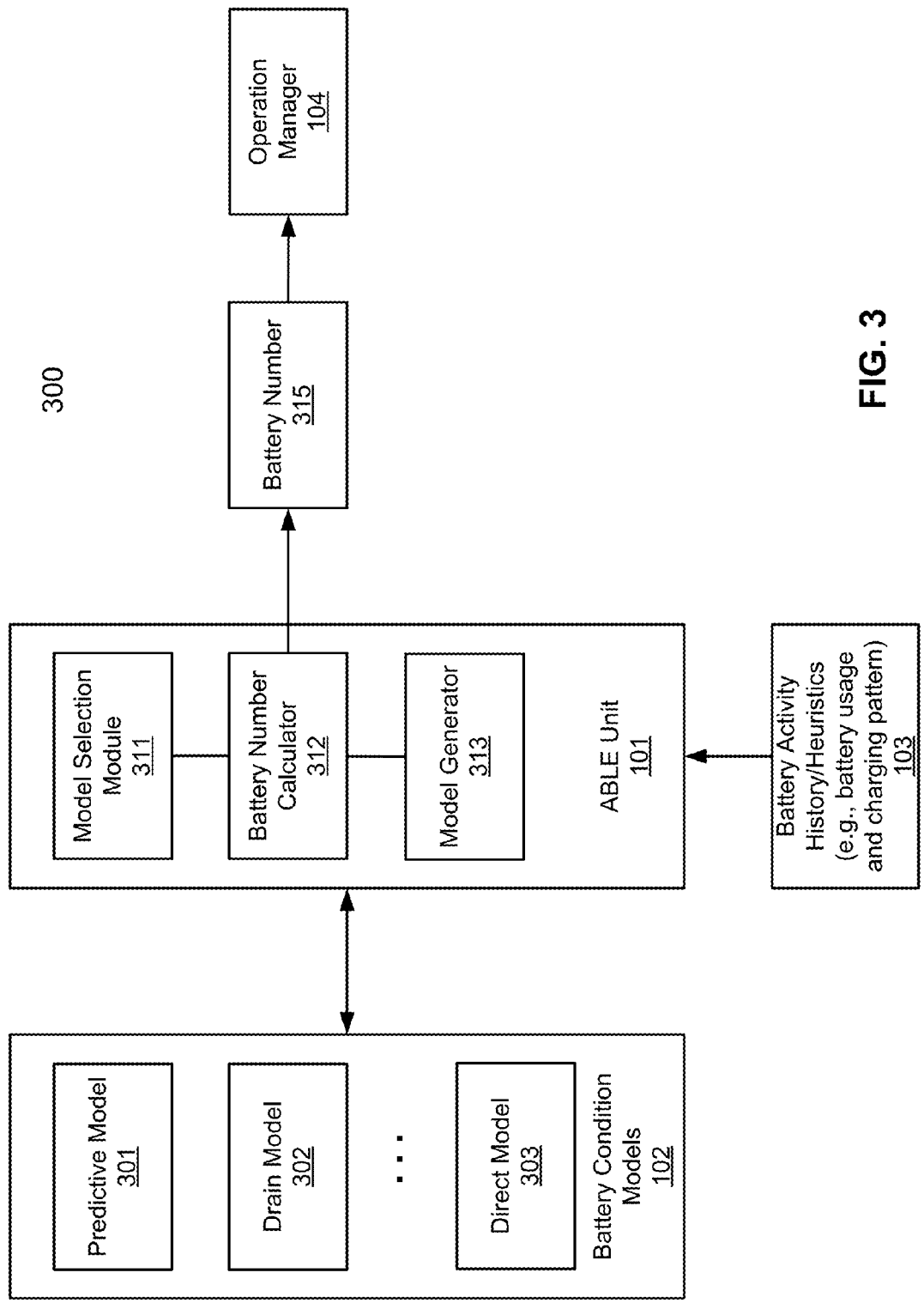
FIG. 3 is a block diagram illustrating an adaptive battery life extension system according to one embodiment of the invention.

FIG. 3 is a block diagram illustrating an adaptive battery life extension system according to one embodiment of the invention. Referring to FIG. 3, in one embodiment, battery models 102 include at least a predictive model 301, a drain model 302, and a direct model 303. Predictive model 301 is configured to predict future battery conditions (e.g., future battery levels) based on past battery operating heuristics 103, including battery levels captured at different points in time in the past and battery charging patterns during one or more periods of time in the past. Drain model 302 is configured to predict future battery conditions (e.g., future battery discharge rate) based on battery discharge patterns in the past, which may be captured or determined by activity analyzer 108 or a user agent (not shown). Direct model 303 is configured to predict future battery conditions based on the current battery level read by PMU 105 or battery monitor 115 from battery 107 at the point in time. ABLE unit 101 then determines battery number 315 presenting the battery condition based on the prediction provided by at least one of predictive model 301, drain model 302, and direct model 303.

In one embodiment, ABLE 101 includes model selection module 311, battery number calculator 312, and model generator 313. Model selection module 311 is configured to select one or more of models 301-303 to predict a battery level, which is utilized by battery number calculator to calculate battery number 315. In one embodiment, before using any of models 301-303, model selection module 311 determines whether that particular model is predictive. In one embodiment, predictive model 301 is preferred over drain model 302 and drain model 302 is preferred over direct model 303, etc.

Before using predictive model 301, model selection module 311 examines the predicted battery data predicted by predictive model 301 in view of actual battery data directly read from the battery over a period of time to determine whether predictive model 301 is still predictive, i.e., whether predictive model 301 is still accurate enough at the point in time to predict future battery conditions. In one embodiment, coefficient of determination techniques, such as R-squared or $R^2$, are utilized to determine whether the predicted data fits with the actual data. The coefficient of determination is to determine whether the predictive model is currently and/or for the foreseeable near future predictive.

R-squared indicates how well data points fit a statistical model, a line or curve. It is a statistic used in the context of statistical models whose main purpose is either the prediction of future outcomes or the testing of hypotheses, on the basis of other related information. It provides a measure of how well observed outcomes are replicated by the model, as the proportion of total variation of outcomes explained by the model. There are several definitions of $R^2$ which are only sometimes equivalent. One class of such cases includes that of simple linear regression. In this case, if an intercept is included, then $R^2$ is simply the square of the sample correlation coefficient between the outcomes and their predicted values. If additional explanators are included, $R^2$ is the square of the coefficient of multiple correlation. In both such cases, the coefficient of determination ranges from 0 to 1. Important cases where the computational definition of $R^2$ can yield negative values, depending on the definition used, arise where the predictions which are being compared to the corresponding outcomes have not been derived from a model-fitting procedure using those data, and where linear regression is conducted without including an intercept. Additionally, negative values of $R^2$ may occur when fitting non-linear functions to data. In cases where negative values arise, the mean of the data provides a better fit to the outcomes than do the fitted function values, according to this particular criterion.

In addition, according to one embodiment, correlation of predicted data amongst different period of times is examined to determine whether the predictive model's predictions are historically consistent. If predictive model 301 passes both tests, it can be utilized. Otherwise, drain model 302 may be utilized instead. Similarly, drain model 302 may be tested using similar techniques and if drain model 302 cannot be used, direct model 303 is utilized. In one embodiment, a combination of one or more of models 301-303 may be utilized.

In one embodiment, if the battery condition is predicted to be too poor or alternatively, if it is predicted that the remaining battery capacity will not last before the predicted next recharge of the battery, one or more of models 301-303 may be adjusted by model generator 313, such that the battery condition will be considered poorer and more actions will be stopped or deferred to preserve battery life until the next predicted recharge of the battery (e.g., soft-landing). Alternatively, the battery condition threshold may be raised higher to defer more actions from being performed. Note that some or all of the components as shown in FIG. 3 may be implemented as software, hardware, or a combination thereof.

Figure 4:
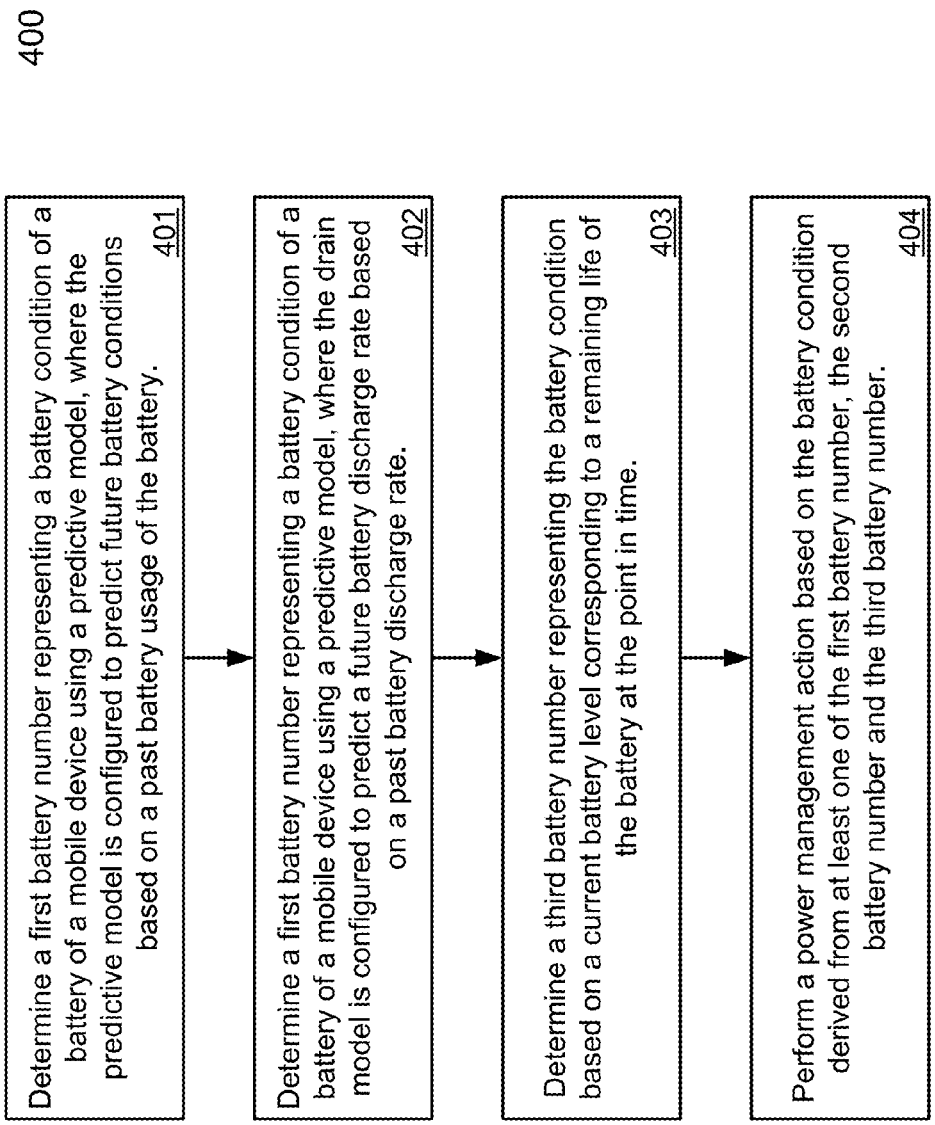
FIG. 4 is a flow diagram illustrating a method for predicting future battery condition according to one embodiment of the invention.

FIG. 4 is a flow diagram illustrating a method for predicting future battery condition according to one embodiment of the invention. Method 400 may be performed by processing logic which may include software, hardware, or a combination thereof. For example, method 400 may be performed by ABLE unit 101 of FIG. 1. Referring to FIG. 4, at block 401, processing logic determines a first battery number representing a battery condition of a battery of a mobile device using a predictive model. The predictive model is configured to predict future battery conditions based on a past battery usage of the battery. At block 402, processing logic determines a second battery number representing the battery condition using a drain model. The drain model is configured to predict a future battery discharge rate based on a past battery discharge rate. At block 403, processing logic determines a third battery number representing the battery condition based on a current battery level corresponding to a remaining life of the battery at the point in time. At block 404, processing logic performs a power management action based on the battery condition derived from at least one of the first battery number, the second battery number and the third battery number.

Figure 5A:
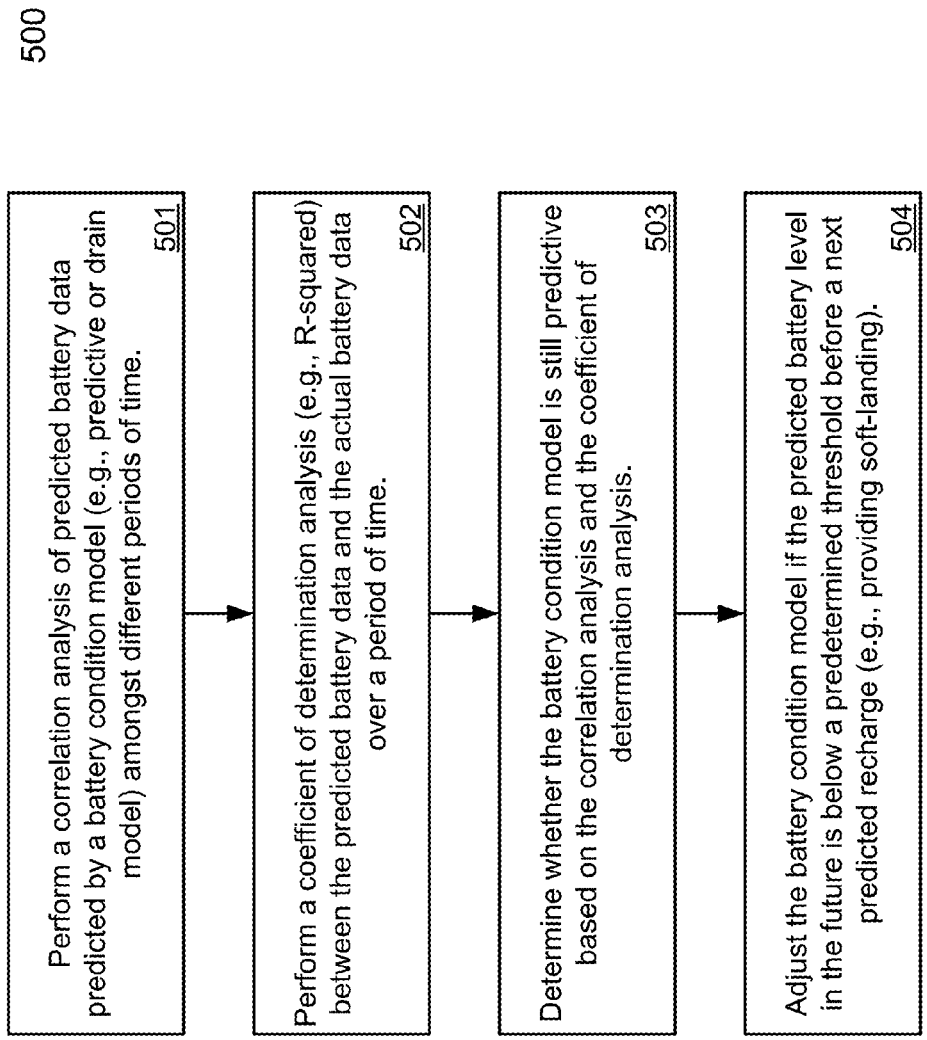
FIG. 5A is a flow diagram illustrating a method for determining whether a battery model is predictive according to one embodiment of the invention.

FIG. 5A is a flow diagram illustrating a method for determining whether a battery model is predictive according to one embodiment of the invention. Method 500 may be performed by processing logic which may include software, hardware, or a combination thereof. For example, method 500 may be performed by ABLE unit 101 of FIG. 1. Referring to FIG. 5A, at block 501, for a given battery condition model (e.g., predictive model, drain model), processing logic performs a correlation analysis of predicted battery data (e.g., battery level, discharge rate) predicted by the battery model amongst at least two periods of time in the past. At block 502, processing logic performs a coefficient of determination analysis (e.g., R-squared) between the predicted battery data and the actual measured data over a period of time. At block 503, processing logic determine whether that particular model is predictive based on the correlation analysis and/or the coefficient of determination analysis. At block 504, if the predicted battery condition or level is below a predetermined threshold, the model is adjusted to provide a soft-landing condition. In one embodiment, soft landing is applied when the expected predicted battery level at any point in the future is poor, and the model is adjusted to generate different predictions which match a more a desirable battery state at that point in the future.

For example, the model may be adjusted so that further prediction will result in a poorer battery condition. Alternatively, the threshold for performing certain actions or events may be raised so that more actions may be deferred, for example, until the next predicted recharge time. On the other hand, if the predicted battery condition (represented by battery operation number or simply battery number) is above a predetermined threshold, the model may also be adjusted to reflect a better battery condition allowing more actions to be performed, for example, before the next predicted recharge time. A battery operating number is generally calculated for time now from the predicted level and actual level at this point in time.

In applying soft landing, processing logic initially sets a desired level TP[0][n] as today's TT[0][n] by default. TP will be the desired level at that time in the day. If any TT[0][n] is below a predetermined battery threshold, processing logic applies a soft-landing algorithm to TP such that TP[0][n] is not below that battery threshold (e.g. 0%, 5%, or other). This algorithm will reduce the discharge rate over some portion of the desired battery levels over the day so as to 1) not enter the low battery threshold, and 2) even out the effective discharge rate over a period of time. In effect, this algorithm finds places where the device is placed on charge and interpolates backward to create a reasonable discharge rate which intercepts with some earlier good (or full) battery states, replacing the predicted battery levels with preferred ones which do not cause low battery.

Figure 5B:
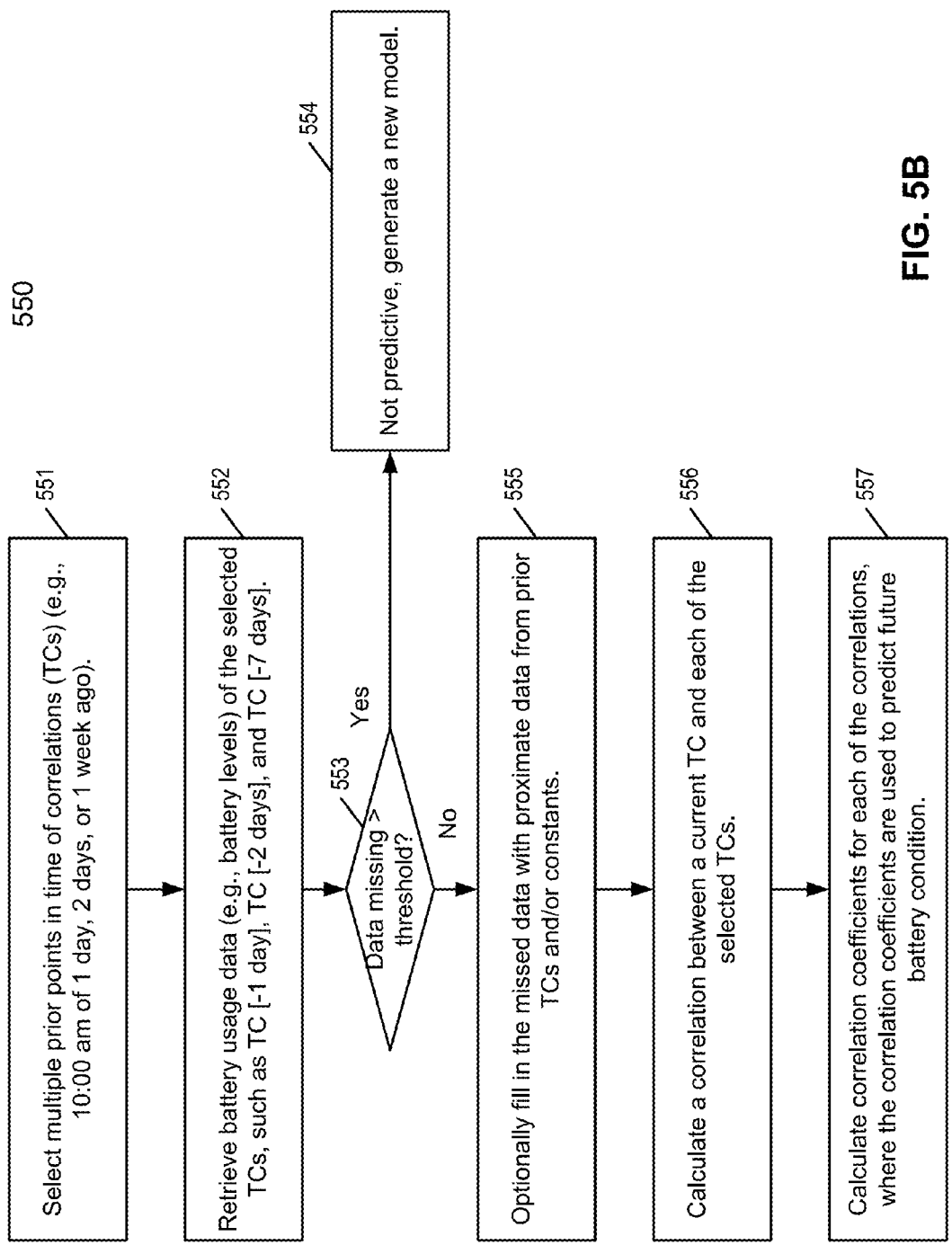
FIG. 5B is a flow diagram illustrating a method for determining correlations of different battery data sets according to one embodiment of the invention.

FIG. 5B is a flow diagram illustrating a method for determining correlations of different battery data sets according to one embodiment of the invention. Method 550 may be performed as part of operations performed at block 501 of FIG. 5A. Referring to FIG. 5B, at block 551, processing logic selects multiple prior points in time of correlations (TCs) (e.g., 15 minute window around 10:00 am of 1 day ago, 2 days ago, and 7 days ago, etc.). In one embodiment, the correlation is between a time period (e.g. 24 hours) for a first day offset (e.g. −7), and for a second day offset (e.g. −8, −9 or −14), where the first day offset is a day expected to be representative of a current day (e.g., today), and the correlation is calculated by executing a correlation function of the set of numbers being one battery level for each time slot out of the time period (e.g., 24 hours) of the first day and the corresponding battery level for each time slot or window of the second day offset. Typically, the battery usage patterns (e.g., user behaviors) on the same or similar time of different days tend to be similar. Thus, the past battery usage data on the same or similar time slot or window tend to more accurately represent the future battery usage around the same or similar time window in the future.

At block 552, processing logic retrieves battery usage data (e.g., battery levels) corresponding to the selected TCs from the battery activity history database, where the battery activity history data has been previously collected as described above. At block 553, it is determined whether some battery data are missing and an amount of the missing data exceeds a predetermined threshold. The data may be missing if a) the battery activity history database is too new that it does not contain old enough history data; b) the database was flushed; c) the device was not on for some of the time; and d) the device was not allowed to record values (e.g., storage locked after reboot). If data is missing for more than a predetermined threshold (e.g., 70%) for those selected TCs, then the model is considered not predictive and another model may be utilized instead. Alternatively, if data of a selected TC is not enough, another prior TC (e.g., 3 days ago data) may be selected.

If the model is considered not predictive due to missing data, at block 554, a new model may be required. Otherwise, at block 555, processing logic optionally fills in the missed data using approximate data from the earlier time slots (e.g., earlier 15 minutes) of the same TCs or some constants. In one embodiment, this approximation could take several forms, e.g. "linear" (interpolate between available points) or "constant" simply fill forward from earlier values. In one embodiment, constant is preferably utilized because it provides a more likely estimate of missing data in common cases. For example, the device is not active (therefore it is only draining slowly) or the device is off (therefore it is probably flat and not being charged).

At block 556, processing logic calculates correlations between a current TC and each of the selected prior TCs, generating corresponding correlation coefficients. In this example, for TC[1-day ago], TC[2-day ago], and TC[7-day ago], processing logic performs the correlation calculation and generates correlations C[−1], C[−2], and C[−7]. The correlations may be calculated using a variety of correlation algorithms. In one embodiment, each of the correlations is examined. A correlation, C[n], may be discard if the correlation is lower than a predetermined threshold (e.g., 0.5). This is taken to mean that that prior day TC[n] was not a good predictor of TC. If there is no correlation remaining after the examination (i.e., all correlations are below the predetermined threshold), the model may not be predictive.

In one embodiment, a correlation coefficient can be calculated using a correlation function as follows:

$$\text{correlation coefficient } r = SSXY/SQRT(SSX*SSY)$$

where SSX, SSY and SSXY are corrected sums:

$$SSX = \text{sum}(x^2) - (\text{sum}(x)^2)/n$$

$$SSY = \text{sum}(y^2) - (\text{sum}(y)^2)/n$$

$$SSXY = \text{sum}(x*y) - ((\text{sum}(x)*\text{sum}(y))/n$$

Parameter n represents a degree of freedom, in this example, n is count(x)−1. Parameters x and y represent vectors of an equal length.

At block 557, a correlation coefficient is calculated for each of the correlations. In one embodiment, for each of the remaining correlations C[n], a correlation coefficient Coef[n] is calculated by normalizing the correlation sum to 1. For example, if correlation C[−7] is discarded, correlation C[−1,−2] is [1.0, 0.6], then the correlation coefficient Coef[−1,−2,−7] will be [0.67, 0.33, 0.0]. A discarded correlation may receive a correlation coefficient of 0. The correlation coefficients calculated above are then used to predict future battery condition. In one embodiment, for each 15 minute slot in a coming day TT, processing logic calculates TT[0+15*n]= Coef[1]*TT[−1 day+15*n]+Coef[1]*TT[−m day+15*n], where m is 1, 2, 7, and n is 0 to 95. The vector TT[0+15*n] {n=0:96} is a set of predicted battery levels for each 15 minute slot. Note that techniques described above can be applied for 24 hours. More hours (e.g., 48) may also be appropriate for devices expected to last longer on a single charge, this requires appropriate modification to the above.

Figure 6A:
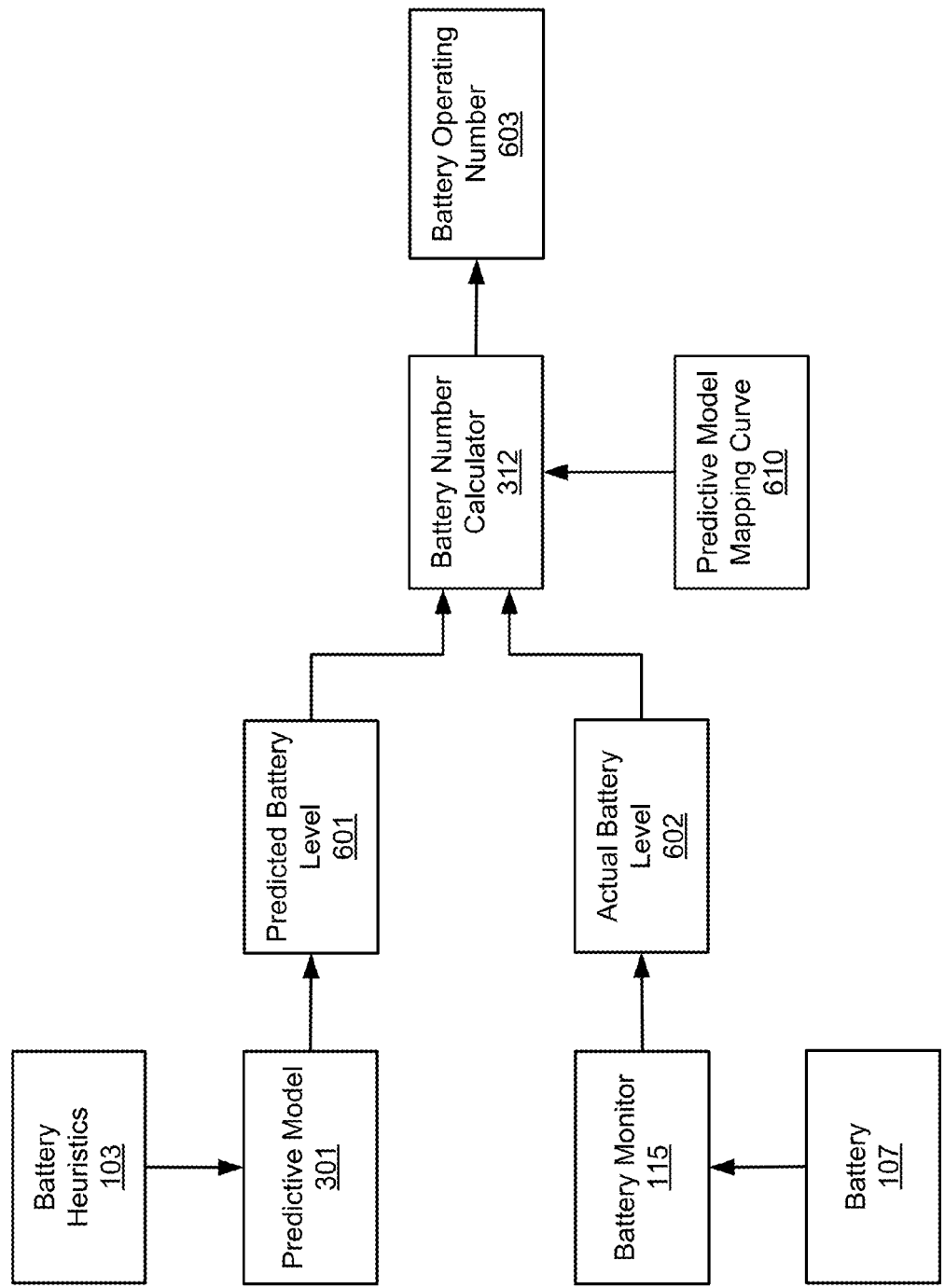
FIG. 6A is a block diagram illustrating a process of a predictive model according to one embodiment of the invention.

According to some embodiments, the outcome of a battery model may be further scaled or mapped to generate an optimal battery number. Different models may have different mapping functions or curves. FIG. 6A is a block diagram illustrating a process of a predictive model according to one embodiment of the invention. Referring to FIG. 6A, according to one embodiment, based on past battery activity history 103, predictive model 301 (assuming it is still predictive) generates a predicted battery level 601 at the point in time. Meanwhile, battery monitor 115 reads the actual battery level 602 directly from battery 107. Based on predicted battery level 601 and actual battery level 602, battery number calculator 312 calculates battery operating number 603 using predictive model mapping curve 610.

According to one embodiment, for a particular point in time (t), the predicted battery level ($B_t$) may be predicted by predictive model 301 based on multiple sample battery levels captured in the past at different points in time as follows:

$$B_t = \alpha_1 B_{t-x1} + \alpha_2 B_{t-x2} + \ldots + \alpha_n B_{t-xn}$$

where coefficients $\alpha_1, \alpha_2, \ldots, \alpha_n$ can be adjusted based on the accuracy of the model. In one embodiment, prediction at time t is evaluated for multiple points where t=now, t=now+1*15 minutes . . . t=now+96*15 minutes, perhaps up to 2 days. In one particular embodiment, the predicted battery level is based on a battery level measured one day ago and a battery level measured one week ago:

$$B_t = \alpha_1 B_{t-1d} + \alpha_2 B_{t-7d}$$

where one day ago and one week ago are one week before t for every t. Alternatively, two days ago data can also be utilized:

$$B_t = \alpha_1 B_{t-1d} + \alpha_2 B_{t-2d} + \alpha_3 B_{t-7d}.$$

Figure 6B:
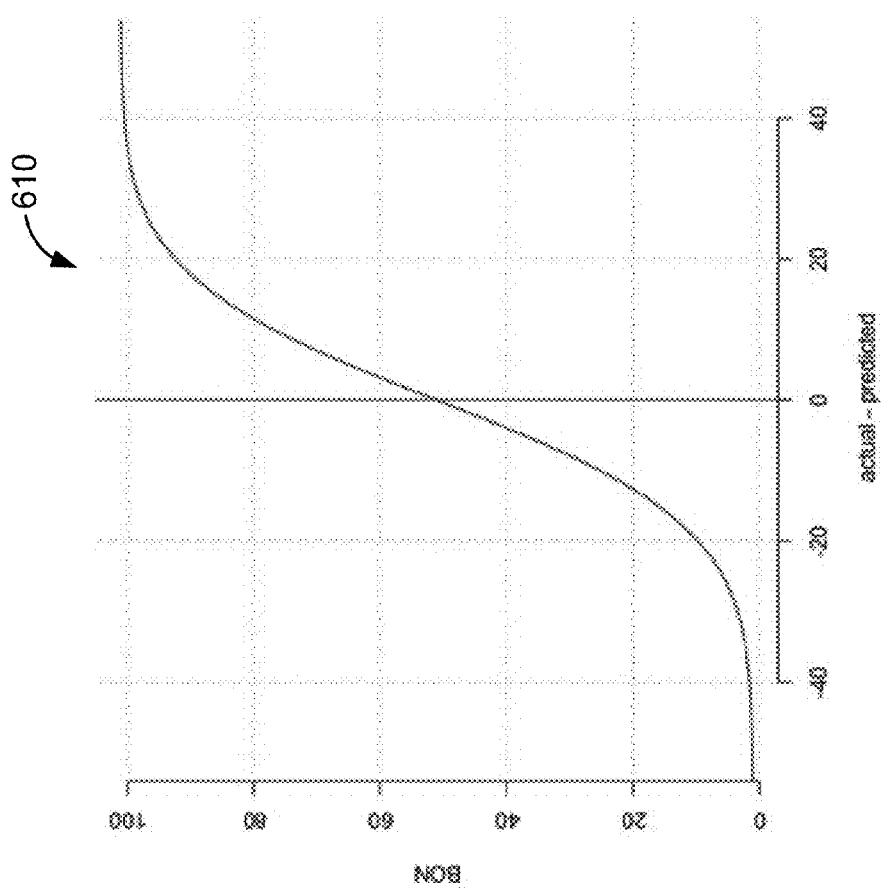
FIG. 6B is an example of a predictive model mapping function according to one embodiment of the invention.

In one embodiment, predictive model 301 is to predict a battery level for each 15 minute window. Battery operating number 603 is calculated based on the discrepancy (e.g., difference) between predicted battery level 601 and actual battery level 602. Based on the input represented by predicted battery level 601 and actual battery level 602, a lookup is performed in predicted model mapping curve or mapping function 610, which may be configured specifically for that particular mobile device and/or operating system. An example of predictive model mapping curve or function 610 is shown in FIG. 6B, where the scale of BON on Y axis is from 1 to 101, while X axis represents the difference between actual battery level 602 and predicted battery level 601.

Figure 7A:
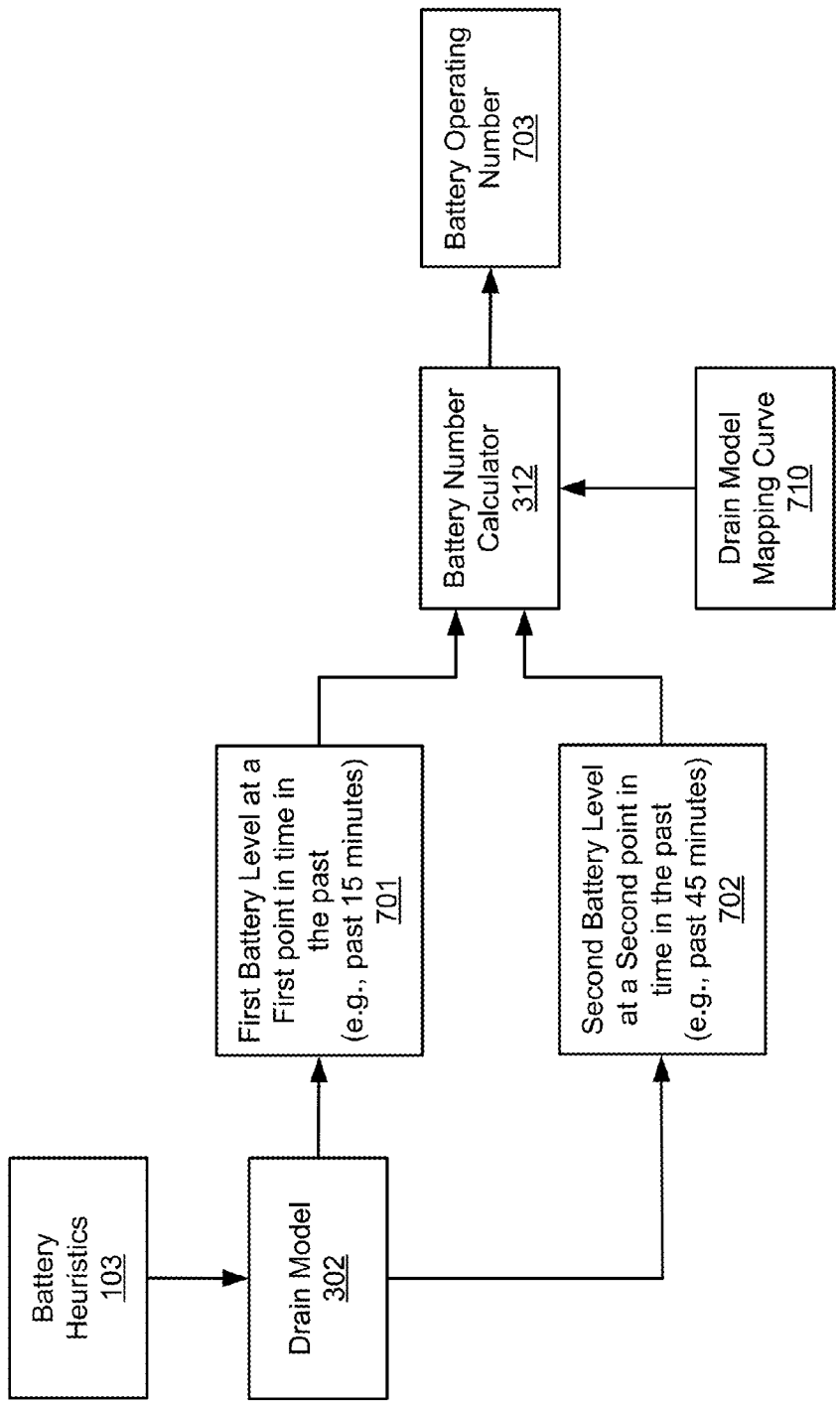
FIG. 7A is a block diagram illustrating a process of a drain model according to one embodiment of the invention.

FIG. 7A is a block diagram illustrating a process of a drain model according to one embodiment of the invention. Referring to FIG. 7A, according to one embodiment, based on past battery activity history 103, drain model 302 (assuming it is still predictive) generates a first predicted battery level 701 at a first point in time in the past (e.g., 15 minute ago) and generates a second predicted battery level 702 at a first point in time in the past (e.g., 45 minute ago). Based on first battery level 701 and second battery level 702, battery number calculator 312 calculates battery operating number 703 using drain model mapping curve or function 710. The drain model also consumes actual battery levels retrieved from the battery activity history.

In one embodiment, drain model 302 is to predict a battery discharge rate for a next predetermined period of time (e.g., next 15 minutes) based on discharge pattern in a past predetermined period of time (e.g., past 45 minutes). A discharge rate at a particular point in time t ($D_t$) may be determined based on a difference between a first battery level at a first point in time in the past (e.g., past 15 minute mark or $B_{t-15}$) and a second battery level at a second point in time in the past (e.g., past 45 minute mark or $B_{t-45}$):

$$D_t = B_{t-\Delta t1} - B_{t-\Delta t2}.$$

Figure 7B:
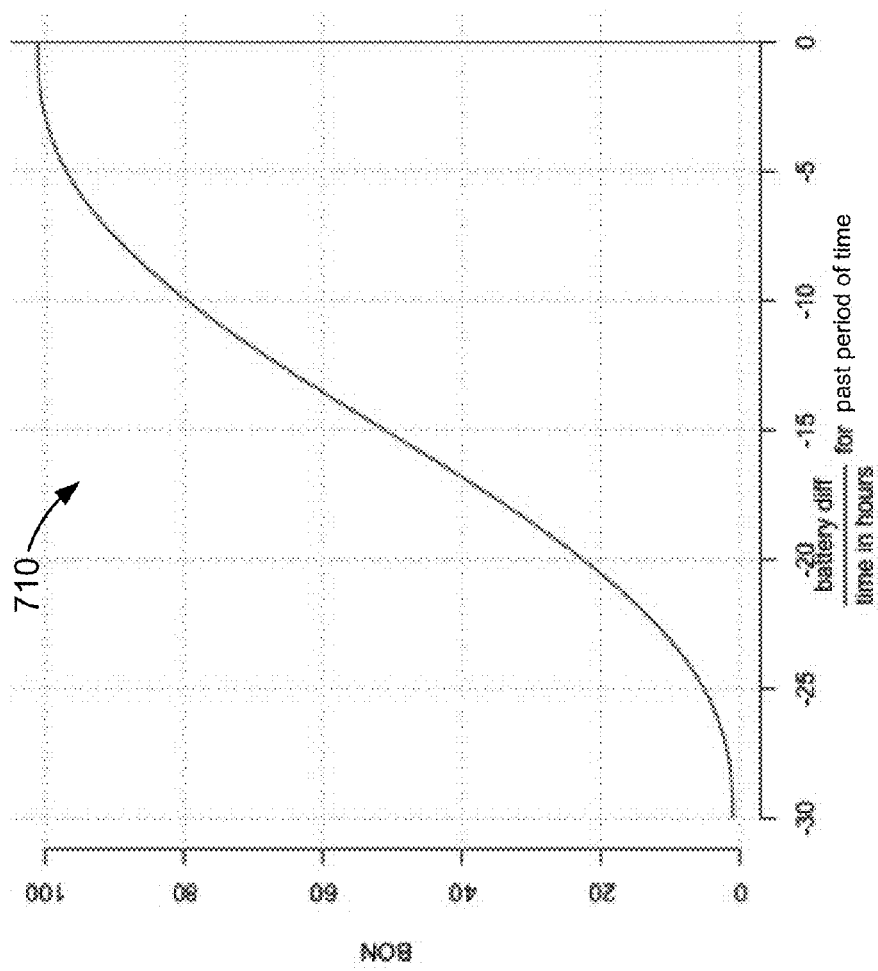
FIG. 7B is an example of a drain model mapping function according to one embodiment of the invention.

In one embodiment, the battery levels captured 15 minutes ago and 45 minutes ago are utilized, where at time t the discharge rate $D_t = B_{t-15} - B_{t-45}$. Based on the input represented by first battery level 701 and second battery level 702, a lookup is performed in drain model mapping curve or mapping function 710, which may be configured specifically for that particular mobile device and/or operating system. An example of drain model mapping curve or function 710 is shown in FIG. 7B, where the scale of BON on Y axis is from 1 to 101, while X axis represents the difference between first battery level 701 and second battery level 702 over a period of time (e.g., 45 minutes).

Figure 8A:
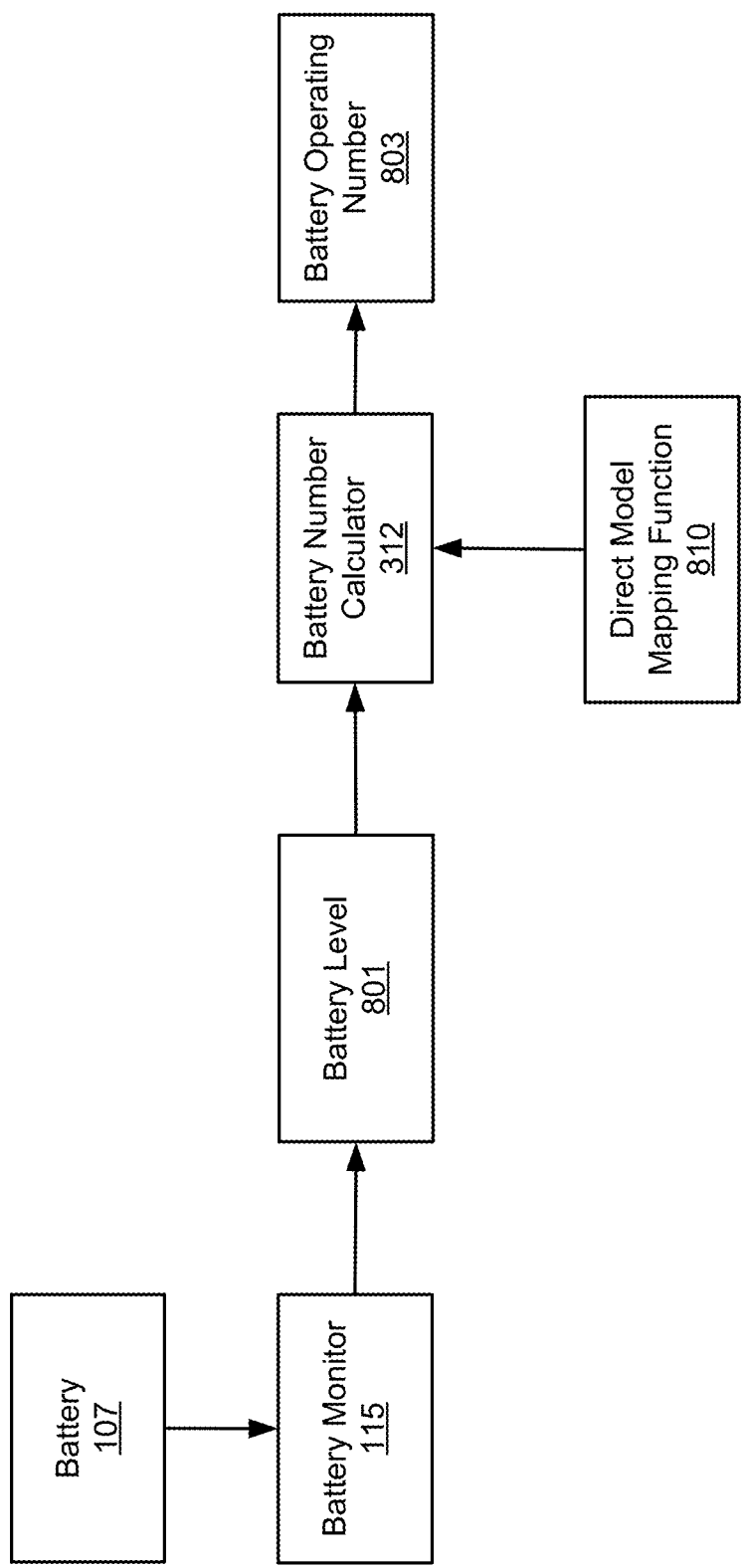
FIG. 8A is a block diagram illustrating a process of a direct model according to one embodiment of the invention.
Figure 8B:
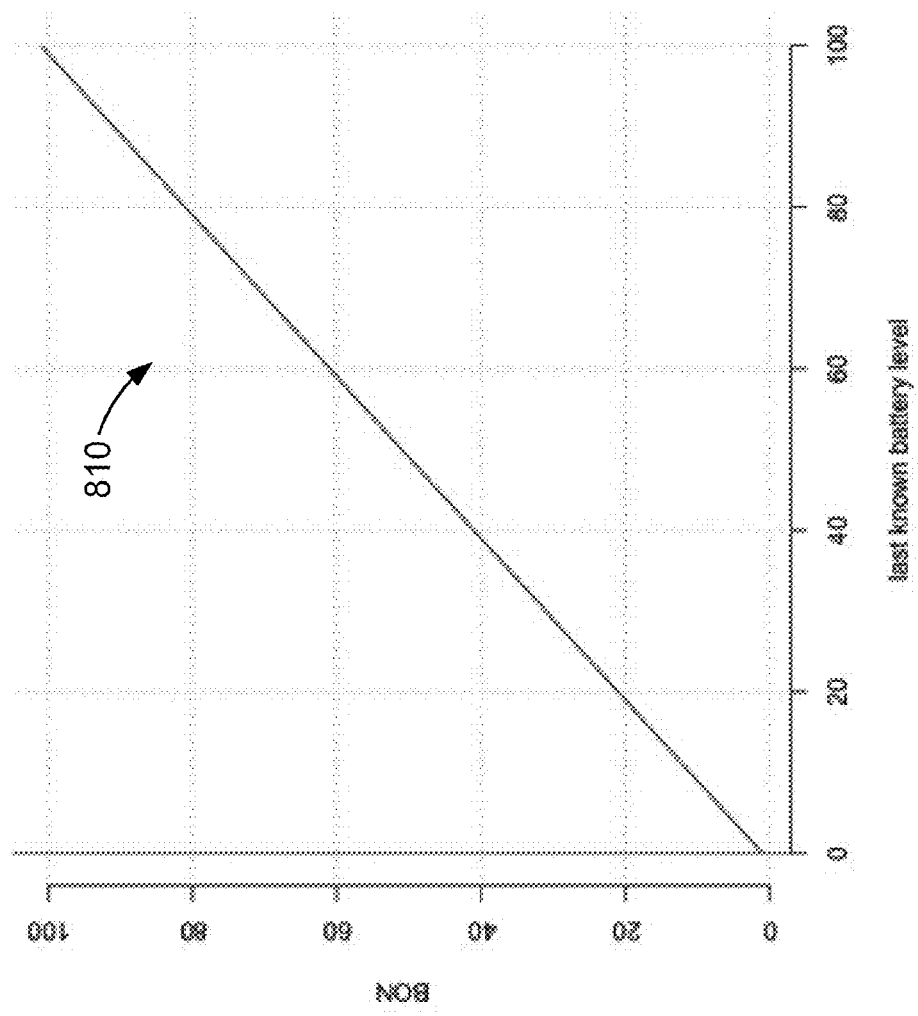
FIG. 8B is an example of a direct model mapping function according to one embodiment of the invention.

FIG. 8A is a block diagram illustrating a process of a direct model according to one embodiment of the invention. Referring to FIG. 8A, according to one embodiment, battery monitor 115 directly reads battery level 801 from battery 107 at the point in time. Similar to the predictive model and the drain model, battery number calculator 312 calculates battery operating number 803 by looking up in direct model mapping function 810 based on battery level 801. An example of direct model mapping function 810 is shown in FIG. 8B, where the scale of BON on Y axis is from 1 to 101, while X axis represents direct battery level from 0 to 100.

According to one embodiment, one model may be utilized in conjunction with another model in a cooperative way in predicting or determining future battery usage. In one embodiment, when the prediction model is utilized, data generated from another model may also be considered. Extreme values of drain of absolute battery level may be used to modify the battery operating number. For example, if it is predicted the battery level will be N % and the battery level is indeed N %, then the predictive model would return an intermediate or good battery operating number. However, if N is very low or very high, that number is modified based on another model such as the drain model or direct model. This represents a situation in which a device recently removed from charge at full battery is likely still near a charger, it can afford to initiate or continue expensive operations such backup, etc. A device that is nearly flat should tend to conserve the remaining charge for user initiated 'foreground' operations rather than options operations such as backup, app update etc., even if it is on track based on the predictive model. This also reflects the property that the predictive model alone is mainly interested in the relative level of battery, instead of the absolute level.

The same can be applied to the discharge rate. A very high discharge rate may indicate future problems, so even if the predictive model indicates that the battery is good or great, the system may reduce the battery operating number for very fast discharge.

The drain model employs both a short term and long term calculation. In one embodiment, recent low rates of drain may override a longer term history of high rates of drain. This avoids an inappropriate period of low battery operating number after a short period of very high drain that has ended.

In one embodiment, the data generated by the predictive model and the drain model may be adjusted as: Clamp (P(predicted−actual)+D2(actual), 0, 100). P is a curve or map which converts the difference between predicted and actual levels in to the base BON, and then D2 is a curve or map (distinct from D, the base curve for direct). D2 is 0 for most of its range (intermediate battery levels) and smoothly approaches 100 in the high battery range (e.g. top 15%) and smoothly approaches −100 in the low battery range (e.g. bottom 15%).

The techniques described above can also be applied to indicate whether a device is coupled to a charger in a good condition. In one embodiment, if the device is connected to a charger which is connected to external power supply (mains), then the base charging BON is set to 100. If the battery level is very low, D2 as described above is applied. That is, if the user is charging and the charger is powerful enough to charge battery and power the device, then power is effectively free. If the user has just plugged in and the battery level is very low (e.g. <15%), then the maximum benefit is to charge the battery as fast as possible, which may mean reducing device's power consumption. Various charging situations exist, including a situation in which a charger is powerful enough to charge battery and power the device, and those which might charge only when the device is idle, or even charge at a reduced rate. If charging is slow, then a reduced BON is appropriate.

Referring back to FIG. 1, battery usage monitor 115 is configured to monitor battery usage and battery charging data of battery 107. Battery usage monitor 115 may periodically monitor the battery usage and charging on a daily basis. The data representing the battery usage and charging data are then used by a battery statistics compiler (not shown) to analyze and compile battery heuristics and charging pattern or trends 103, which can be stored in a persistent storage device of the portable device (not shown). Battery usage heuristics and charging pattern 103 may be constantly or periodically updated over a long period of time to develop more accurate trends of battery usage and charging behavior of the user. In one embodiment, the battery heuristics compiler may further calculate a daily average battery usage and/or an estimated daily battery charging schedule of the user. In one embodiment, the daily average herein is the weighted average for values recorded at a particular time slot or window (e.g., 15 minutes wide) of the day over several days. The weight in the weighted average is generated by the model generator. For example, an average for 10 am time slot may be calculated based on the data recorded or captured around 10 am of each of the past several days. As a result, it can roughly determine when and how long in a regular day that the portable device is powered by the battery without charging.

Battery usage heuristics and charging pattern 103 can be used to determine a user intent at a given point in time based on the battery usage level at the given point in time. For example, assuming at a given point in time, battery usage monitor 115 receives data representing a battery usage level. The battery usage level is used to compare with the daily average battery usage level obtained from battery usage activity history 103 and optional application activities (for example, obtained via activity analyzer 108 of FIG. 1). Based on the comparison, a user intent determination unit (not shown) can determine the user intent and possible subsequent user actions with the portable device. As a result, the user intent determination unit is able to approximately determine whether that particular battery level is within a normal battery usage range of a typical day of the user.

According to one embodiment, if the difference between the battery usage level at the point in time and the average daily battery usage level exceeds a predetermined threshold, it may indicate that the battery usage of the portable device is unusual. A power management action may be performed to accommodate such an unusual situation. For example, if the battery usage level is too high compared to the daily average battery usage, power consumption of certain hardware or software may be reduced to conserve power capacity, such that the remaining power capacity can last for the estimated period of time without charging. On the other hand, if the battery usage is too low compared to the average battery usage level, certain performance of the hardware and/or software may be increased (which leads to higher power consumption) as long as the remaining power capacity of the battery can last the estimated period of time without charging. Such power management actions may be performed automatically without user intervention or knowledge.

The above techniques can be applied to a variety of situations. For example, suppose a user charges its device more than once a day from Monday through Friday during a week. If the total charge consumed in a day is less than the battery's capacity, it is likely the user is charging the device because it is convenient, not because the battery is likely to run out. If the charge used in a day exceeds the battery's capacity modestly, it may be worth it to the user for the power management system to be a little conservative about power usage throughout the day to stretch the capacity of the battery and avoid the need to charge mid-day. If the charge consumed in a day exceeds the batteries capacity significantly then the user is certainly using its device fully and the power management system's effect on performance to avoid the mid-day charge would likely be upsetting to the user.

In another example, suppose the user charges its device once a day on Monday through Friday during a week, and the battery usage level of the device before it is charged averages out to a level, referred to as a daily average usage level, with a reasonably low standard deviation. This may imply the user's behavior is about the same each weekday. Should on a given weekday, if the battery usage level falls below the average usage level, with some margin, it implies that there is something different about the user's behavior on this day. This boundary crossing of average behavior can inform the power management system that the user is more likely to run out of battery on that particular day, and it may be in its best interest to conserve power.

In a further example, suppose a user charges their device and removes it from charge at approximately the same time each work day. If the standard deviations for the average times are low enough, the power management system could infer the duration of the user's work day. Alternatively, the power management system can infer which time slots (e.g., 9:00 am to 11:00 am and 2:00 pm to 4:00 pm) of a particular work day (e.g., Monday to Friday) it can consume more power than other time slots. Being able to infer the user's work day would allow the power management system to set power budgets throughout the day in an attempt to ensure that the battery is not depleted before the day is over. Such a power management system operating based on user activities or user behavior is referred to herein as a user level power management system. The goal is to infer the user intent during different time and/or days from the battery usage heuristics and charging pattern, such that the unusual user behavior can be captured early enough before it is too little too late for the power management system to act. As a result, the operations of the portable device can be dynamically configured (in terms of balance of performance and power consumption), such that the user can have the best experience of the portable device.

Operation manager 104 may represent a combination of one or more of a resource manager, an application launcher (e.g., springboard), a scheduler, a power management unit, and/or other components of the operating system. Operation manager 104 is configured to manage or collect information such as an operating state or status of certain hardware and/or software operations (e.g., entering an airplane mode) and to communicate such information to program activity analyzer 108. Based on the operating state or status information, program activity analyzer 108 is configured to collect information with activity data collected from programs 110 and optional battery usage heuristics and charging pattern 103.

The user intent determination unit (which may be implemented as part of ABLE unit 101) then infers user intent and possible subsequent user interaction with the portable device at that point in time based on the information gathered by program activity analyzer 108. Based on the user intent and the possible subsequent user interaction, the user intent determination unit transmits a signal to operation manager 104 to recommend a power management action to be performed on the portable device. In response, operation manager 104 may perform certain power management actions on the hardware such as shutting down the WiFi, lower the display brightness, etc., as well as software such as causing certain programs to change its behavior to reduce certain performance of the programs. Alternatively, if it is determined based on the user intent that the remaining power capacity of the battery can last much longer than the estimated period of time without charging, the performance of the portable device may be increased to further enhance user experience.

The techniques described above can be applied to admission control processes of a data processing system. In a data processing system, applications and system services have access to an application with which they can request a permission to perform an action with certain identifying characteristics. Those characteristics, which include the identity of the requesting application or service, a key or identifier for a class of activity, and a value representing a particular property of the activity, such as which mailbox, or a numeric value. The system can then evaluate the importance to the user of that activity based upon the information, and in conjunction with the battery condition number, determine if the activity should go ahead. The identifying characteristics may be passed around the system to account for conditions in which the requesting application may delegation the invocation of the action to a third service or services. The determination of the importance of the action may include analysis of the battery impact of past similar actions, or of other information provided by the application, such as which mailboxes the user frequently uses.

Again, the goal of user level power management is to optimize the performance, battery life and thermal response of devices and computers. If the power management system has enough information about what the user is doing, it may be able to improve performance or save power which in turn could extend battery life or reduce system temperature. Applications can be a source of input to a user power management system, explicitly those that outline the user's near future in the real world.

The above techniques can be applied to a variety of different situations. For example, presenting a boarding pass for checking into a flight on a plane tells the power management system that the user is likely going to be in airplane mode for the duration of the flight. When in the near future the user enables airplane mode, the power management system can infer that the user will want their device's battery to last for the duration of the flight, and will not likely have access to power until after the flight. The power management system could respond by sacrificing some performance in favor of stretching the battery to last for the duration of the flight. Simply knowing that the device is in airplane mode gives part of this information, but it lacks a likely duration that airplane mode will be enabled and cannot make a useful prediction about how much battery conservation should be applied. By using the fact that the user has checked in for a flight, and the metadata from the boarding pass, the power management system gets two data points for airplane mode and a likely duration.

Another example could be using an eWallet application such as Passbook to purchase a drink at a coffee house. This coupled with GPS location largely staying the same would suggest that the user will be enjoying their drink in the coffee house for the next 20 to 30 minutes. If they should be using their device in that time period they are likely to be doing so intently, (reading the news, playing a game, etc.), such that they would like their device to be particularly responsive. This sort of information could tell the power management system that for the next 20-30 minutes it is in the user's best interest to sacrifice some battery life in favor of improved performance.

In a further example, if the user starts watching a movie using a media player of the portable device, the system can determine whether the battery can last for the duration of the movie based on the metadata of the movie. If the remaining power capacity of the battery cannot last that long, certain power management actions may be performed, such as reducing performance of other applications since the user unlikely use those applications while watching the movie. Alternatively, the frame rate may be reduced in order to reduce power consumption. Furthermore, it the system detects that the device is operating in a relatively dark environment (e.g., playing a video game), which may be detected via an ambient or light sensor (and its corresponding application), the system may automatically reduces the backlight of the display to further reduce power consumption of a general-purpose processor such as a central processing unit (CPU) and/or to increase performance of a special-purpose processor such as a graphical processing unit (GPU).

It is important to note that the monitoring, detection, and power management actions described above are performed automatically without user intervention or user knowledge. Unlike convention power management systems, the user level power management system described throughout this application does not focus on detection of power usage and notification of the user regarding such power usage (e.g., alert to the user that the battery is running low. Rather, the user level power management system focuses on user behavior of a particular user and automatically adjusts the operations of the portable device in order to improve the user experience with the portable device. Each user may have different behavior and pattern, by employing a user agent within the portable device, the user level power management system can "learn" that particular user's behavior and adapt to that particular user's life style, even without the user knowledge. A typical user may not be interested in the notification of a battery usage level. Rather, the user may be more interested in enjoying the experience of the portable device without interruption by the unwelcome notification. All a user cares about is that the battery can support whatever the user intends to do at the moment, regardless how the system fulfills such a requirement.

Figure 9:
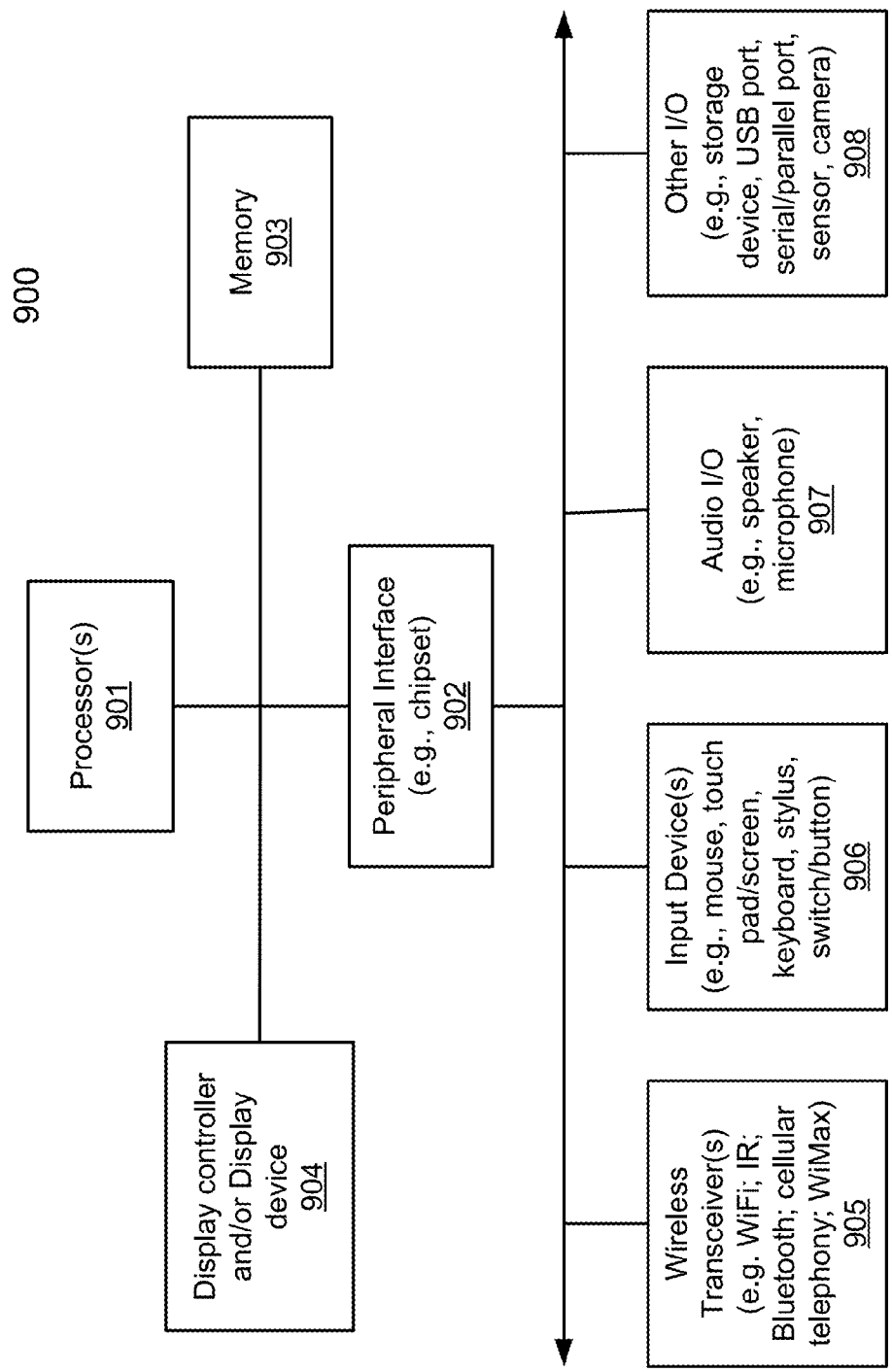
FIG. 9 is a block diagram illustrating an example of a data processing system which may be used with one embodiment of the invention.

FIG. 9 is a block diagram illustrating an example of a data processing system which may be used with one embodiment of the invention. For example, system 900 may represents any of data processing systems described above performing any of the processes or methods described above. System 900 may represent a desktop (e.g., iMac™ available from Apple Inc. of Cupertino, Calif.), a laptop (e.g., MacBook™), a tablet (e.g., iPad™), a server, a mobile phone (e.g., iPhone™), a media player (e.g., iPod™ or iPod Touch™), a personal digital assistant (PDA), a personal communicator, a gaming device, a network router or hub, a wireless access point (AP) or repeater, a set-top box, or a combination thereof.

Referring to FIG. 9, in one embodiment, system 900 includes processor 901 and peripheral interface 902, also referred to herein as a chipset, to couple various components to processor 901 including memory 903 and devices 905-908 via a bus or an interconnect. Processor 901 may represent a single processor or multiple processors with a single processor core or multiple processor cores included therein. Processor 901 may represent one or more general-purpose processors such as a microprocessor, a central processing unit (CPU), or the like. More particularly, processor 901 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 901 may also be one or more special-purpose processors such as an application specific integrated circuit (ASIC), a field programmable gate array (FPGA), a digital signal processor (DSP), a network processor, a graphics processor, a network processor, a communications processor, a cryptographic processor, a co-processor, an embedded processor, or any other type of logic capable of processing instructions. Processor 901 is configured to execute instructions for performing the operations and steps discussed herein.

Peripheral interface 902 may include memory control hub (MCH) and input output control hub (ICH). Peripheral interface 902 may include a memory controller (not shown) that communicates with a memory 903. Peripheral interface 902 may also include a graphics interface that communicates with graphics subsystem 904, which may include a display controller and/or a display device. Peripheral interface 902 may communicate with graphics device 904 via an accelerated graphics port (AGP), a peripheral component interconnect (PCI) express bus, or other types of interconnects.

An MCH is sometimes referred to as a Northbridge and an ICH is sometimes referred to as a Southbridge. As used herein, the terms MCH, ICH, Northbridge and Southbridge are intended to be interpreted broadly to cover various chips who functions include passing interrupt signals toward a processor. In some embodiments, the MCH may be integrated with processor 901. In such a configuration, peripheral interface 902 operates as an interface chip performing some functions of the MCH and ICH. Furthermore, a graphics accelerator may be integrated within the MCH or processor 901.

Memory 903 may include one or more volatile storage (or memory) devices such as random access memory (RAM), dynamic RAM (DRAM), synchronous DRAM (SDRAM), static RAM (SRAM), or other types of storage devices. Memory 903 may store information including sequences of instructions that are executed by processor 901, or any other device. For example, executable code and/or data of a variety of operating systems, device drivers, firmware (e.g., input output basic system or BIOS), and/or applications can be loaded in memory 903 and executed by processor 901. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

Peripheral interface 902 may provide an interface to IO devices such as devices 905-908, including wireless transceiver(s) 905, input device(s) 906, audio IO device(s) 907, and other IO devices 908. Wireless transceiver 905 may be a WiFi transceiver, an infrared transceiver, a Bluetooth transceiver, a WiMax transceiver, a wireless cellular telephony transceiver, a satellite transceiver (e.g., a global positioning system (GPS) transceiver) or a combination thereof. Input device(s) 906 may include a mouse, a touch pad, a touch sensitive screen (which may be integrated with display device 904), a pointer device such as a stylus, and/or a keyboard (e.g., physical keyboard or a virtual keyboard displayed as part of a touch sensitive screen). For example, input device 906 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

Audio IO 907 may include a speaker and/or a microphone to facilitate voice-enabled functions, such as voice recognition, voice replication, digital recording, and/or telephony functions. Other optional devices 908 may include a storage device (e.g., a hard drive, a flash memory device), universal serial bus (USB) port(s), parallel port(s), serial port(s), a printer, a network interface, a bus bridge (e.g., a PCI-PCI bridge), sensor(s) (e.g., a motion sensor, a light sensor, a proximity sensor, etc.), or a combination thereof. Optional devices 908 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips.

Note that while FIG. 9 illustrates various components of a data processing system, it is not intended to represent any particular architecture or manner of interconnecting the components; as such details are not germane to embodiments of the present invention. It will also be appreciated that network computers, handheld computers, mobile phones, and other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques shown in the figures can be implemented using code and data stored and executed on one or more electronic devices. Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals).

The processes or methods depicted in the preceding figures may be performed by processing logic that comprises hardware (e.g. circuitry, dedicated logic, etc.), firmware, software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method, comprising:
    determining, by an adaptive battery life extension (ABLE) unit, a first battery number representing a battery condition of a battery of a mobile device using a predictive model, wherein the predictive model is configured to predict future battery conditions based on a past battery usage of the battery;
    determining a second battery number representing the battery condition using a drain model, wherein the drain model is configured to predict a future battery discharge rate based on a past battery discharge rate;
    determining a third battery number representing the battery condition based on a current battery level corresponding to a remaining life of the battery at the point in time; and
    performing, by power management logic, a power management action based on the battery condition derived from at least one of the first battery number, the second battery number and the third battery number.

2. The method of claim 1, wherein determining the first battery number using the predictive model comprises:
    determining a first difference between a first predicted battery level predicted by the predictive model for the point in time and an actual battery level read from the battery at the point in time; and
    transforming the first difference into the first battery number using a first transform function associated with the predictive model.

3. The method of claim 2, wherein determining the second battery number using the drain model comprises:
    determining a second difference between a third battery level at a third point in time in the past and a fourth battery level at a fourth point in time in the past over a second predetermined period of time; and
    transforming a second difference into the second battery number using a second transform function associated with the drain model.

4. The method of claim 3, wherein the third battery level was captured 15 minutes ago, and wherein the fourth battery level was captured 45 minutes ago.

5. The method of claim 3, wherein determining the third battery number using the direct model comprises transforming the current battery level read from the battery into the third battery number using a third transform function associated with the direct model.

6. The method of claim 1, further comprising determining whether the predictive model is predictive prior to using the predictive model, wherein the drain model is utilized if the predictive model is not predictive.

7. The method of claim 6, wherein determining whether the predictive model is predictive comprises:
    obtaining from a battery activity history database a set of actual battery level data captured at a plurality of points in time during a first predetermined period of time in the past;
    obtaining from the battery activity history database a first set of predicted battery level data predicted by the predictive model corresponding to the plurality of points in time; and
    performing a coefficient of determination operation based on the predicted battery level data of the first set with the actual battery level data to determine whether the predictive model performs within a predetermined tolerable range.

8. The method of claim 7, wherein performing a coefficient of determination operation comprises performing an R-squared process on the predicted battery level data and the actual battery level data.

9. The method of claim 8, further comprising:
    obtaining from the battery heuristic database a second set of predicted battery level data predicted by the predictive model during a second predetermined period of time in the past;
    determining correlation between the first set of predicted battery level data and the second set of predicted battery level data; and
    determining whether the predicted model is predictive based on the determined correlation and the coefficient of determination.

10. The method of claim 9, wherein the first predetermined period of time comprises a fifteen minute window one week ago and the second predetermined period of time comprises a fifteen minute window one day ago.

11. A non-transitory computer-readable medium having instructions stored therein, which when executed by a processor, cause the processor to perform a method, the method comprising:
    determining, by an adaptive battery life extension (ABLE) unit, a first battery number representing a battery condition of a battery of a mobile device using a predictive model, wherein the predictive model is configured to predict future battery conditions based on a past battery usage of the battery;

determining a second battery number representing the battery condition using a drain model, wherein the drain model is configured to predict a future battery discharge rate based on a past battery discharge rate;

determining a third battery number representing the battery condition based on a current battery level corresponding to a remaining life of the battery at the point in time; and performing, by power management logic, a power management action based on the battery condition derived from at least one of the first battery number, the second battery number and the third battery number.

12. The non-transitory computer-readable medium of claim 11, wherein determining the first battery number using the predictive model comprises:

determining a first difference between a first predicted battery level predicted by the predictive model for the point in time and an actual battery level read from the battery at the point in time; and transforming the first difference into the first battery number using a first transform function associated with the predictive model.

13. The non-transitory computer-readable medium of claim 12, wherein determining the second battery number using the drain model comprises:

determining a second difference between a third battery level at a third point in time in the past and a fourth battery level at a fourth point in time in the past over a second predetermined period of time; and transforming a second difference into the second battery number using a second transform function associated with the drain model.

14. The non-transitory computer-readable medium of claim 13, wherein the third battery level was captured 15 minutes ago, and wherein the fourth battery level was captured 45 minutes ago.

15. The non-transitory computer-readable medium of claim 13, wherein determining the third battery number using the direct model comprises transforming the current battery level read from the battery into the third battery number using a third transform function associated with the direct model.

16. The non-transitory computer-readable medium of claim 11, wherein the method further comprises determining whether the predictive model is predictive prior to using the predictive model, wherein the drain model is utilized if the predictive model is not predictive.

17. The non-transitory computer-readable medium of claim 16, wherein determining whether the predictive model is predictive comprises:

obtaining from a battery activity history database a set of actual battery level data captured at a plurality of points in time during a first predetermined period of time in the past;

obtaining from the battery activity history database a first set of predicted battery level data predicted by the predictive model corresponding to the plurality of points in time; and performing a coefficient of determination operation based on the predicted battery level data of the first set with the actual battery level data to determine whether the predictive model performs within a predetermined tolerable range.

18. The non-transitory computer-readable medium of claim 17, wherein performing a coefficient of determination operation comprises performing an R-squared process on the predicted battery level data and the actual battery level data.

19. The non-transitory computer-readable medium of claim 18, wherein the method further comprises:

obtaining from the battery heuristic database a second set of predicted battery level data predicted by the predictive model during a second predetermined period of time in the past;

determining correlation between the first set of predicted battery level data and the second set of predicted battery level data; and determining whether the predicted model is predictive based on the determined correlation and the coefficient of determination.

20. The non-transitory computer-readable medium of claim 19, wherein the first predetermined period of time comprises a fifteen minute window one week ago and the second predetermined period of time comprises a fifteen minute window one day ago.

21. A portable device, comprising:

an adaptive battery life extension (ABLE) unit to determine a first battery number representing a battery condition of a battery of a mobile device using a predictive model, wherein the predictive model is configured to predict future battery conditions based on a past battery usage of the battery, determine a second battery number representing the battery condition using a drain model, wherein the drain model is configured to predict a future battery discharge rate based on a past battery discharge rate and determine a third battery number representing the battery condition based on a current battery level corresponding to a remaining life of the battery at the point in time; and power management logic to perform a power management action based on the battery condition derived from at least one of the first battery number, the second battery number and the third battery number.

22. The portable device of claim 21, wherein determining the first battery number using the predictive model comprises:

determining a first difference between a first predicted battery level predicted by the predictive model for the point in time and an actual battery level read from the battery at the point in time; and transforming the first difference into the first battery number using a first transform function associated with the predictive model.

23. The portable device of claim 22, wherein determining the second battery number using the drain model comprises:

determining a second difference between a third battery level at a third point in time in the past and a fourth battery level at a fourth point in time in the past over a second predetermined period of time; and transforming a second difference into the second battery number using a second transform function associated with the drain model.

24. The portable device of claim 23, wherein determining the third battery number using the direct model comprises transforming the current battery level read from the battery into the third battery number using a third transform function associated with the direct model.

* * * * *